(12) United States Patent
Hayworth

(10) Patent No.: US 6,324,047 B1
(45) Date of Patent: Nov. 27, 2001

(54) SYMMETRICAL FEED-THRU

(75) Inventor: Wilson Hayworth, Raleigh, NC (US)

(73) Assignee: AVX Corporation, Myrtle Beach, SC (US)

( * ) Notice: Subject to any disclaimer, the term of this patent is extended or adjusted under 35 U.S.C. 154(b) by 0 days.

(21) Appl. No.: 09/587,968

(22) Filed: Jun. 6, 2000

(51) Int. Cl.⁷ .................................................. H01G 4/35
(52) U.S. Cl. .................... 361/302; 361/303; 361/306.1; 361/306.3; 361/508
(58) Field of Search ..................................... 361/302, 303, 361/306.1, 306.3, 301.4, 308.3, 309, 508

(56) References Cited

U.S. PATENT DOCUMENTS

| | | |
|---|---|---|
| 3,255,396 | 6/1966 | Heron, Jr. et al. . |
| 3,320,557 | 5/1967 | Garstang . |
| 3,426,257 | 2/1969 | Youngquist . |
| 3,989,988 | 11/1976 | Püetz et al. . |
| 4,747,019 | 5/1988 | Ito et al. . |
| 4,908,590 | 3/1990 | Sakamoto et al. . |
| 5,034,849 | 7/1991 | Vetter . |
| 5,097,389 | 3/1992 | Ito et al. . |
| 5,448,445 | 9/1995 | Yamate et al. . |
| 5,650,759 | 7/1997 | Hittman et al. . |
| 5,880,925 | * 3/1999 | DuPre' et al. ........................ 361/303 |
| 5,910,879 | 6/1999 | Herbert . |
| 5,923,523 | 7/1999 | Herbert . |
| 5,930,109 | * 7/1999 | Fishler ................................ 361/508 |
| 5,959,829 | * 9/1999 | Stevenson et al. .................. 361/302 |
| 6,061,227 | * 5/2000 | Nogi .................................... 361/303 |

FOREIGN PATENT DOCUMENTS

| | | |
|---|---|---|
| 915488A2 | 12/1999 | (EP) . |
| 11329902 | 11/1999 | (JP) . |

* cited by examiner

Primary Examiner—Dean A. Reichard
Assistant Examiner—Nguyen T Ha
(74) Attorney, Agent, or Firm—Dority & Manning, P.A.

(57) ABSTRACT

A symmetrical feed-thru filter construction is provided in a square-shaped chip with corner terminations and unoriented feed-thrus running diagonally across the chip for suppressing transient or undesired frequencies from a signal. The construction can be of either a capacitor or varistor based design and can be altered during manufacture to handle signals of specified strengths.

27 Claims, 1 Drawing Sheet

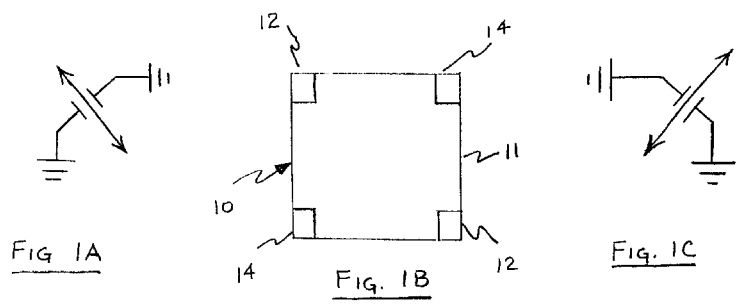
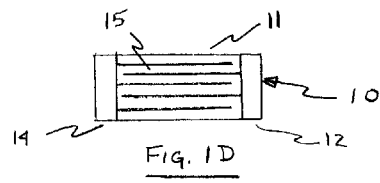
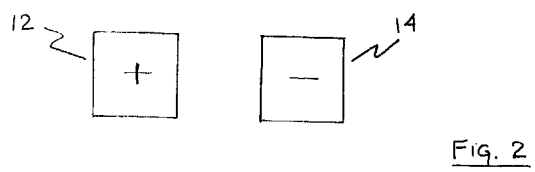
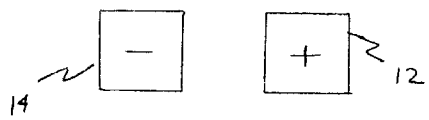
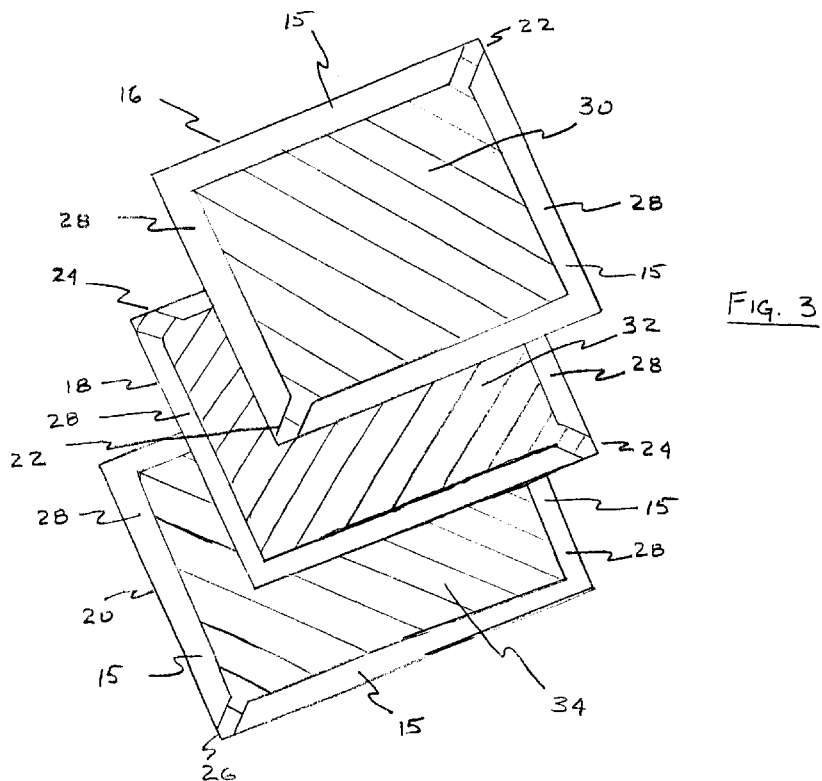

SYMMETRICAL FEED-THRU

BACKGROUND OF THE INVENTION

1. Field of the Invention

The present invention relates to a multi-layer ceramic capacitor or varistor adapted to be mounted on the surface of a circuit board. In particular, the invention relates to a square chip design for a capacitor or varistor for mounting on an electronic circuit board with corner terminations. More precisely, the present invention relates to a symmetrical multi-layer capacitor or varistor chip design for mounting on a circuit board to act as a filter therefore, with corner terminations and unoriented feed-thrus placed diagonally across the chip.

2. Description of the Prior Art

With today's push toward miniaturization, Electromagnetic Interference (EMI) could potentially render a circuit useless or worse still it could cause an incorrect answer to be generated from a computer by randomly powering a gate up or down. As a result filtering out undesirable signal noise (i.e., unwanted frequencies) has become a major design consideration for new electronic devices.

To solve this problem, designers have used capacitors and varistors for some time. Additionally they have been using specifically design electrical devices known as feed-thru filters to specifically solve these problems. Feed-thru filter devices are well know in the art. They have been used in everything from cellular phones and laptop computers to implantable medical devices such as cardiac pacemakers. Their primary function is to attenuate undesirable or transient voltage frequencies or EMI from a signal passing through a circuit. They can be either capacitor- or varistor-based devices.

There are two primary capacitor/varistor geometries in use in the industry—the rectangular chip and the discoidal chip. The monolithic or multi-layer rectangular chip configuration is produced in very high volumes in highly automated facilities around the world. One example of such a rectangular chip is disclosed in commonly owned U.S. Pat. No. 5,880,925 entitled "Surface Mount Multilayer Capacitor."

In many instances, a chip requires a significant amount of care be exercised during the manufacture, packaging, and installation of the chip. Sometimes a chip requires additional machinery or man-hours to ensure that the chip is oriented properly throughout the manufacturing process.

The termination process is the widely-used industry process in which chips are oriented to form the terminals on the sides of the chip and then re-oriented to form the terminals on the ends of the chip. The electrically conductive terminals allow for electrical connection between the lead structures of the electrode plates and the circuitry in which the chip is ultimately placed.

The complete disclosure of U.S. Pat. No. 5,880,925 (including all figures and discussion thereof) is fully incorporated herein by reference.

Additional United States Patents provide examples of capacitor-based feed-thru filters for use in attenuating undesired signal frequencies. Examples include U.S. Pat. Nos. 3,255,396; 3,320,557; 3,426,257; 3,989,988; 4,747,019; 4,908,590; 5,097,389; 5,650,759; and 5,595,829. The complete disclosures of all such patents (including all figures and descriptions thereof) are fully incorporated herein by reference.

SUMMARY OF THE INVENTION

The present invention recognizes and addresses various of the foregoing limitations and drawbacks concerning feed-thru filter manufacturing. Thus, broadly speaking, a principal object of the subject invention is an improved design for feed-thru filters with respect to manufacturing difficulties. More particularly, a main concern is improved design layouts for feed-thru filters that enhance manufacturing ease and require less printed circuit board (PCB) space while maintaining at least the same capabilities as prior art feed-thru filters.

Another more particular object of the subject invention is to provide a feed-thru filter that by design requires no side or end orientation for manufacturing and implementation. In such a context, it still a further object to provide such a feed-thru filter which is square in shape.

Still another more particular object of the subject invention is to provide a square feed-thru filter with terminals in each of the four corners, wherein the terminals extend along the entirety of the height of the chip. It is a further more particular object of the subject invention to provide a feed-thru filter wherein the feed-thrus are oriented diagonally across the chip.

Additional objects and advantages of the invention are set forth in, or will be apparent to those of ordinary skill in the art from, the detailed description herein. Also, it should be appreciated that modifications and variations to the specifically illustrated, referenced, and discussed steps, features, materials, or devices hereof may be practiced in various uses and embodiments of this invention without departing from the spirit and scope thereof, by virtue of present reference thereto. Such variations may include, but are not limited to, substitution of equivalent steps, materials, means, or features for those shown, referenced or discussed, and the functional, operational, or positional reversal of various features, steps, parts, or the like.

Still further, it is to be understood that different embodiments, as well as different presently preferred embodiments, of this invention may include various combinations or configurations of presently disclosed steps, features, or elements, or their equivalents (including combinations of steps or features or configurations thereof not expressly shown in the figures or stated in the detailed description). One exemplary such embodiment of the present invention relates to an improved design for a feed-thru filter for electrical circuitry.

Such a design includes a symmetrical, square design employing a multi-layer capacitor/varistor based feed-thru filter. The feed-thru filter comprises an interleaved series of electrode plates made of any capacitor/varistor material well known in the industry, for example zinc oxide. Other examples of such materials would be barium titanate or tantallum for use with the capacitor based variation of the subject invention.

At one set of opposing corners of each plate extend electrode tab structures for electrical connection to the terminals of the device. Each plate has its electrode tab structures in the opposite set of opposing corners from the plate either above, below, or both above and below it. In other words, the plates are interdigitated.

The feed-thru filter, itself, has four terminals total, one in each corner of the device. The terminals extend along the entirety of the height of the device. It is these terminals, to which, the electrode tab structures of each electrode plate are attached. They are arranged in such a way so that the polarity of a set of terminals in opposing corners is the same. That set of terminals, however, will have a different polarity from the remaining set of terminals.

The feed-thru filter of the subject invention utilizes less space with greater capability while enhancing the ease of manufacturing and implementation of itself. The present invention's symmetric square-shape leaves greater room on the PCB than does a discoidal or rectangular design. With today's push toward miniaturization, integration of components into smaller and smaller areas is absolutely mandatory. In its shape alone, the present invention has solved problems for circuit designers.

Additionally, the instant invention enables manufacturers to create the corner terminals on existing machinery without concern as to the orientation of the chip. Unlike rectangular chips which have distinctive length-to-width ratios, a square chip with corner terminals can be processed through the termination process without end or side orientation. The termination process merely adds the terminals at the corners. It is not required that the terminals be placed at an exact location along the length of the rectangular chip. The use of just four terminals, one for each corner, allows for the termination process to create the terminals in just one pass through the machinery as opposed to multiple passes for other chips. Similarly, due to its symmetrical design, the chip requires less effort in packaging and installation, yet provides equal or greater performance.

Those of ordinary skill in the art will better appreciate the features and aspects of such embodiments and others, upon review of the remainder of the specification.

BRIEF DESCRIPTION OF THE DRAWINGS

A full and enabling disclosure of the present invention, including the best mode thereof, directed to one of ordinary skill in the art, is set forth in the specification, which makes reference to the appended figures, in which:

FIG. 1A is a schematic diagram showing the feed-thru direction between opposing corner terminals and the ground.

FIG. 1B is an overhead view of the multi-layer symmetrical chip showing the corner terminations.

FIG. 1C is a schematic diagram showing the feed-thru direction between opposing corner terminals in a direction opposite that in FIG. 1A and the ground.

FIG. 1D is a front view of the multi-layer symmetrical chip showing each alternating layer's connection to a corner terminal via tab electrode structures and how the corner terminals extend along the entirety of the chip's height.

FIG. 2 is a schematic diagram showing the orientation of corner terminals and their interdigitated polarities.

FIG. 3 is an exploded view of at least three of the ceramic electrode plates within the symmetric chip showing the alternating direction of the feed-thru and their respective main electrode portions and tab electrode structures.

Repeat use of reference characters throughout the present specification and appended drawings is intended to represent the same or analogous features, steps, or elements of the invention.

DETAILED DESCRIPTION OF THE PREFERRED EMBODIMENTS

The miniaturization of cellular phones, laptop computers, and other electronic devices pushed passive electronic component manufacturers to begin developing integrated components into smaller surface mountable packages or arrays. In addition to space and cost savings, these integrated components fathered generations of smaller, more powerful electronic components.

These newer, more powerful components brought with them there own problems which needed correction. Among these problems was the very physics behind the functionality of some of these components. For example, as capacitors grew smaller, the reduction in volumetric area reduced the capacitance of the capacitor. In order to overcome this problem, manufacturers have been combining passive components into built-in arrays. Other manufacturers began looking for optimal space saving shapes with maximum volumetric area while still capable of manufacture with existing machinery.

While the particulars of the subject invention may be adapted for use in other electronic components, the example discussed herein are in the context of a capacitor/varistor feed-thru filter.

With more specific reference to the subject invention, FIG. 1B represents an overhead view of a multi-layer symmetrical chip showing corner terminations. The subject invention comprises a feed-thru filter construction 10 having a square-shaped symmetrical body 11 (i.e., a length-to-width ratio of 1:1) with an electrically conductive terminal 12, 14 in each corner of the construction 10. An exemplary measurement of one embodiment is approximately 40 mils by 40 mils with a height of up to 35 mils maximum. As the construction 10 is a passive component, it can be either a capacitor or a varistor based component.

As seen in FIGS. 1A and 1C, the feed-thru paths are unoriented until installation of the chip 10. While the pathway (as indicated by the arrows in the figures) is diagonal across each electrode plate 16, 18, 20, only installation determines the direction of the flow of current through the construction 10. Additionally, the construction 10 has four electrically conductive terminals 12, 14. There is one terminal 12, 14 in each corner of the construction 10. It is these terminals 12, 14 that provide the electrical connection between the construction 10 and the circuitry into which it is ultimately placed.

As represented to those of ordinary skill in the art from present FIG. 3, the internal composition of the construction 10 comprise a plurality of electrode plates 16, 18, 20 stacked, pressed, and sintered together in a spaced apart arrangement to form the filter through which the signal passes. These electrode plates 16, 18, 20 can be made of any material used in the industry in the construction of either a capacitor or varistor. Examples of such materials include zinc oxide and barium titanate.

Between the electrode plates 16, 18, 20 is a dielectric material 15 to electrical insulate the plates 16, 18, 20 from each other and from the body 11 of the construction 10. Similarly, in order to electrically insulate the edges of the electrode plates 16, 18, 20 from the body 11, each electrode plate 16, 18, 20 has at least a five mil border 28 of the dielectric material 15 except where the electrical connection between the electrode plates 16, 18, 20 and the terminals 12, 14 is made.

For example, the first electrode plate 16, shown in FIG. 3, is designed to have a main electrode portion 30 and two electrode tab structures 22 extending therefrom. The electrode tab structures 22 extend into a set of opposing corners. The second electrode plate 18 has an identical main electrode portion 32 and two identical electrode tab structures 24. The electrode tab structures 24 of the second electrode plate 18, however, extend into the opposite set of opposed corners. The third electrode plate 20, is identical in all respects to the first electrode plate 16. The fourth electrode plate (not shown) would be identical in all respects to the second electrode plate 18. In this manner, the multiple electrode plates 16, 18, 20 are interdigitated to alternating sets of opposed corners. It is in those two sets of opposed corners where the electrode tab structures 22, 24, 26 and the terminals 12, 14 are electrically connected.

In order to ease the manufacturing of the construction 10 and to ensure the electrical connection with each electrode plate 16, 18, 20, the terminals 12, 14 extend along the entirety of the height of the body 11. As can be seen in FIG. 2, each of the sets of terminals 12, 14 gain an opposing polarity once installed. As the construction 10 is symmetrical and unoriented prior to its installation, one of ordinary skill in the art would recognize that either terminal set 12, 14 could become positive and either could become negative.

While most stacked capacitor/varistor components have limiting length-to-width characteristics, the ease of manufacturing, packaging, and installation of the present invention are due to its symmetrical unoriented design. The use of just four corner terminals allows for reduced manufacturing time. The symmetric shape and unoriented layout allow for "pick and place" packaging and installation. As a result, the subject invention solves several problems facing electrical component designers today. It reduces the real estate required by an individual component on PCBs while maintaining equal or better capabilities.

It will be understood by those skilled in the art that modification may be made in the structures and methods set forth herein without departing from the spirit and scope of the invention as defined in the claims that follow, and it is intended that the structures and methods described above and shown in the accompanying drawings are to be construed as illustrative only.

What is claimed is:

1. A feed-thru filter construction comprising:
    a) a symmmetrical body having a height and including a plurality of first and second electrode plates interleaved in opposed and space apart relation;
    b) a dielectric material located between each opposing set of said first and second electrode plates; and
    c) said first and second electrode plates including a main electrode portion in electrical communication with two spaced apart tab structure which extend therefrom, wherein said spaced apart tab structures of each of said first and second electrode plates extend to a pair of opposing corners of said first or second electrode plates and wherein said pair of opposing corners on each of said first and second electrode plates differs from the pair of opposing corners of said first or second electrode plate either above, below, or both above and below said electrode plate.

2. A feed-thru filter construction as in claim 1, wherein the symmetrical body comprises a square shape.

3. A feed-thru filter construction as in claim 1, wherein each of the plurality of first and second electrode plates have two tab electrode structures in electrical communication with the main electrode portion and which extend therefrom, one each in opposing corners of the said main electrode portion on said first and second electrode plates.

4. A feed-thru filter construction as in claim 3, further comprising:
    d) corner terminals for electrical communication between said tab electrode structures of said first and second electrode plates and an electric circuit.

5. A feed-thru filter construction as in claim 4, wherein the corner terminals of said symmetrical body extend along the entirety of the height of said symmetric body.

6. A feed-thru filter construction as in claim 4, wherein the corner terminals in a first set of opposing corners of the symmetrical body define a pair of electrical terminals with a first polarity and the corner terminals in the remaining set of opposing corners of said symmetrical body define a pair of electrical terminals of a second polarity.

7. A feed-thru filter construction as in claim 6, wherein the plurality of first and second electrode plates are interleaved so as to be in electrical communication with said corner terminals in an interdigitated arrangement.

8. A feed-thru filter construction as in claim 1, wherein said symmetrical body has a unitary structure characteristic of a plurality of stacked, pressed and sintered ceramic-electrode layers.

9. A feed-thru filter construction as in claim 1, wherein said construction comprises a multilayer capacitor device.

10. A feed-thru filter construction as in claim 1, wherein said construction comprises a multilayer varistor device.

11. A feed-thru filter construction as in claim 1, wherein said electrode plates have around their periphery, except where the tab electrode structures extend into opposing corners, at least a five mil border of dielectric material to electrically insulate them from said symmetrical body.

12. A feed-thru filter construction comprising:
    a) a square-shaped symmetrical body having a height and including a plurality of first and second electrode plates interleaved in opposed and spaced apart relation;
    b) a dielectric material located between each opposing set of said first and second electrode plates; and
    c) said first and second electrode plates including a main electrode portion in electrical communication with two spaced apart tab electrode structures extending therefrom in opposing corners of said main electrode portion on said first and second electrode plates.

13. A feed-thru filter construction as in claim 12, further comprising:
    d) corner terminals for electrical communication between said tab electrode structures of said first and second electrode plates and an electric circuit.

14. A feed-thru filter construction as in claim 13, wherein the corner terminals of said symmetrical body extend along the entirety of the height of said symmetric body.

15. A feed-thru filter construction as in claim 13, wherein the corner terminals in a first set of opposing corners of the symmetrical body define a pair of electrical terminals with a first polarity and the corner terminals in the remaining set of opposing corners of said symmetrical body define a pair of electrical terminals of a second polarity.

16. A feed-thru filter construction as in claim 15, wherein the plurality of first and second electrode plates are interleaved so as to be in electrical communication with said corner terminals in an interdigitated arrangement.

17. A feed-thru filter construction as in claim 12, wherein said symmetrical body has a unitary structure characteristic of a plurality of stacked, pressed and sintered ceramic-electrode layers.

18. A feed-thru filter construction as in claim 12, wherein said construction comprises a multilayer capacitor device.

19. A feed-thru filter construction as in claim 12, wherein said construction comprises a multilayer varistor device.

20. A feed-thru filter construction as in claim 12, wherein said electrode plates have around their periphery, except where the tab electrode structures extend into opposing corners, at least a five mil border of dielectric material to electrically insulate them from said symmetrical body.

21. A feed-thru filter construction comprising:
    a) a square-shaped symmetrical body having a height and including a plurality of first and second electrode plates interleaved in opposed and spaced apart relation;

b) a dielectric material located between each opposing set of said first and second electrode plates;

c) said first and second electrode plates including a main electrode portion in electrical communication with two spaced apart tab electrode structures extending therefrom in opposing corners of said main electrode portion on said first and second electrode plates; and d) corner terminals for electrical communication between said tab structures of said first and second electrode plates and an electric circuit, said corner terminals in a first set of opposing corners of the symmetrical body define a pair of electrical terminals with a first polarity and said corner terminals in the remaining set of opposing corners of said symmetrical body define a pair of electrical terminals of a second polarity.

22. A feed-thru filter construction as in claim 21, wherein the corner terminals of said symmetrical body extend along the entirety of the height of said symmetric body.

23. A feed-thru filter construction as in claim 21, wherein the plurality of first and second electrode plates are interleaved so as to be in electrical communication with said corner terminals in an interdigitated arrangement.

24. A feed-thru filter construction as in claim 21, wherein said symmetrical body has a unitary structure characteristic of a plurality of stacked, pressed and sintered ceramic-electrode layers.

25. A feed-thru filter construction as in claim 21, wherein said construction comprises a multilayer capacitor device.

26. A feed-thru filter construction as in claim 21, wherein said construction comprises a multilayer varistor device.

27. A feed-thru filter construction as in claim 21, wherein said electrode plates have around their periphery, except where the tab electrode structures extend into opposing corners, at least a five mil border of dielectric material to electrically insulate them from said symmetrical body.

* * * * *